US009123596B2

(12) United States Patent  
Chang et al.

(10) Patent No.: US 9,123,596 B2
(45) Date of Patent: Sep. 1, 2015

(54) DISPLAY PANEL AND SEALING PROCESS THEREOF

(71) Applicant: Au Optronics Corporation, Hsinchu (TW)

(72) Inventors: Wei-Chih Chang, Miaoli County (TW); Chih-Hung Hsiao, Changhua County (TW); Hsien-Hung Chen, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/269,205

(22) Filed: May 5, 2014

(65) Prior Publication Data

US 2014/0332827 A1   Nov. 13, 2014

(30) Foreign Application Priority Data

May 9, 2013   (TW) .............................. 102116519 A

(51) Int. Cl.
*H01L 51/52* (2006.01)
*H01L 51/54* (2006.01)
*H01L 51/56* (2006.01)
*H01L 27/12* (2006.01)

(52) U.S. Cl.
CPC ........ *H01L 27/1262* (2013.01); *H01L 27/1248* (2013.01)

(58) Field of Classification Search
None
See application file for complete search history.

(56) References Cited

U.S. PATENT DOCUMENTS

| 6,998,776 | B2 | 2/2006 | Aitken et al. |
| 7,407,423 | B2 | 8/2008 | Aitken et al. |
| 7,602,121 | B2 | 10/2009 | Aitken et al. |
| 8,063,560 | B2 | 11/2011 | Aitken et al. |
| 8,125,146 | B2 | 2/2012 | Park |
| 8,415,880 | B2 * | 4/2013 | Choi et al. ............... 313/512 |
| 8,448,468 | B2 | 5/2013 | Pastel et al. |

(Continued)

FOREIGN PATENT DOCUMENTS

| CN | 1798710 | 7/2006 |
| CN | 101009319 | 8/2007 |
| TW | 200607383 | 2/2006 |
| TW | 201018301 | 5/2010 |
| TW | I326133 | 6/2010 |
| TW | I333286 | 11/2010 |
| TW | I359624 | 3/2012 |

OTHER PUBLICATIONS

Definition of partial downloaded from URL < http://www.merriam-webster.com/dictionary/partial > on Jan. 14, 2015.*

(Continued)

*Primary Examiner* — Joseph Schoenholtz
(74) *Attorney, Agent, or Firm* — Jianq Chyun IP Office

(57) ABSTRACT

A display panel and a sealing process are provided. The display panel has a display area and a non-display area; the sealing process includes following steps. A first substrate having a pixel array in the display area is provided. An absorption material layer is formed in the non-display area of the first substrate. A second substrate having a sealing material layer in the non-display area is provided. The second substrate and the first substrate are assembled, and a display medium is formed therebetween. The absorption material layer and the sealing material layer at least partially overlap. A laser processing process is performed on the sealing material layer, so that the first substrate is adhered to the second substrate by the sealing material layer. The absorption material layer is adopted for absorbing a portion of a laser beam passing through the sealing material layer in the laser processing process.

23 Claims, 17 Drawing Sheets

(56) References Cited

U.S. PATENT DOCUMENTS

| | | | |
|---|---|---|---|
| 2003/0222061 A1* | 12/2003 | Langer et al. | 219/121.66 |
| 2004/0207314 A1 | 10/2004 | Aitken et al. | |
| 2005/0001545 A1 | 1/2005 | Aitken et al. | |
| 2006/0009109 A1 | 1/2006 | Aitken et al. | |
| 2006/0084348 A1* | 4/2006 | Becken et al. | 445/25 |
| 2007/0007894 A1 | 1/2007 | Aitken et al. | |
| 2007/0128967 A1* | 6/2007 | Becken et al. | 445/25 |
| 2007/0176549 A1 | 8/2007 | Park | |
| 2009/0308105 A1 | 12/2009 | Pastel et al. | |
| 2010/0129666 A1* | 5/2010 | Logunov et al. | 428/426 |
| 2013/0239622 A1 | 9/2013 | Haase Pastel et al. | |
| 2014/0027743 A1* | 1/2014 | Nishido | 257/40 |
| 2014/0183458 A1* | 7/2014 | Lee et al. | 257/40 |

OTHER PUBLICATIONS

Absorption Coefficient downloaded from URL <http://pveducation.org/pvcdrom/pn-junction/absorption-coefficient> on Jan. 9, 2015.*

Refractive index and extinction coefficient of materials downloaded from URL < http://homepages.rpi.edu/~schubert/Educational-resources/Materials-Refractive-index-and-extinction-coefficient.pdf> on Jan. 9, 2015.*

Cruz, Rui, et. al.. "Glass—Glass Laser-Assisted Glass Frit Bonding." IEEE Transactions on Components, Packaging and Manufacturing Technology 2.12 (2012) 1949-956.*

* cited by examiner

US 9,123,596 B2

DISPLAY PANEL AND SEALING PROCESS THEREOF

CROSS-REFERENCE TO RELATED APPLICATION

This application claims the priority benefit of Taiwan application serial no. 102116519, filed on May 9, 2013. The entirety of the above-mentioned patent application is hereby incorporated by reference herein and made a part of this specification.

BACKGROUND OF THE INVENTION

1. Field of the Invention

The invention relates to a display panel and a sealing method thereof, and more particularly to a display panel using laser sealing and a sealing method of the display panel.

2. Description of Related Art

With the advancement of science and technology, bulky cathode ray tube (CRT) displays have been gradually replaced. Display panels including liquid crystal display (LCD) panels, organic light-emitting diode (OLED) display panels, electrophoretic display (EPD) panels, and plasma display panels (PDPs) have thus become the mainstream display panels in the near future. One of the existing sealing methods commonly applied to the display panels is the laser sealing method. During a laser sintering process, the sintering process is inevitably performed on a lead line region of a pixel array substrate where the metal lead lines are located. Since parts of the fit are subject to the laser beam reflected by the metal lead lines, the frit is heated in an uneven manner, which accordingly poses a negative impact on the sealing effects.

SUMMARY OF THE INVENTION

The invention is directed to a display panel and a sealing method thereof, whereby the issues of the unevenly heated frit and the resultant unfavorable sealing effects may be resolved.

In an embodiment of the invention, a sealing method of a display panel is provided. The display panel has a display area and a non-display area that surrounds the display area, and the sealing process includes following steps. A first substrate having a pixel array in the display area is provided. An absorption material layer is formed in the non-display area of the first substrate. A second substrate having a sealing material layer in the non-display area is provided. The second substrate and the first substrate are assembled, and a display medium is formed therebetween. The absorption material layer and the sealing material layer at least partially overlap. A laser processing process is performed on the sealing material layer of the second substrate, such that the first substrate is adhered to the second substrate by the sealing material layer, and the absorption material layer absorbs a portion of a laser beam passing through the sealing material layer in the laser processing process.

In an embodiment of the invention, a display panel is provided. The display panel has a display area and a non-display area that surrounds the display area. The display panel includes a first substrate, a second substrate, and a display medium. The first substrate includes a pixel array and an absorption material layer, the pixel array is located in the display area, and the absorption material layer is located in the non-display area. The second substrate includes a sealing material layer in the non-display area, and the absorption material layer and the sealing material layer at least partially overlap in a vertical projection direction. The display medium is located between the first substrate and the second substrate.

As is discussed above, in the display panel and the sealing method thereof, the absorption material layer highly capable of absorbing the laser beam is formed in the non-display area of the pixel array substrate. Since a portion of the laser beam passing the sealing material layer may be absorbed by the absorption material layer, the defects of the unevenly heated frit and the resultant unfavorable sealing effects may be prevented.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

According to a conventional laser sealing method, a laser beam passing the frit (i.e., the laser beam that is not absorbed by the frit) is reflected by metal lead lines in a lead line region below the frit, and the reflected laser beam is then absorbed by the frit. Thereby, the frit may be overly sintered on the condition that there are metal leads below the frit. This often causes broken metal lead lines and the resultant bright (and/or dark) line defects, and the lift span of the active device and the device performance are both reduced accordingly. Besides, since a portion of the frit is affected by metal reflection, issues of the unevenly heated fit and the resultant unfavorable sealing effects frequently arise. To resolve said issues, energy of the laser beam in the lead line region is required to be slightly adjusted, which raises the difficulty level of the manufacturing process, increases the manufacturing time, and reduces the production. Thus, a sealing method capable of resolving the issues of the conventional laser sealing method is provided herein.

Figure 1A:
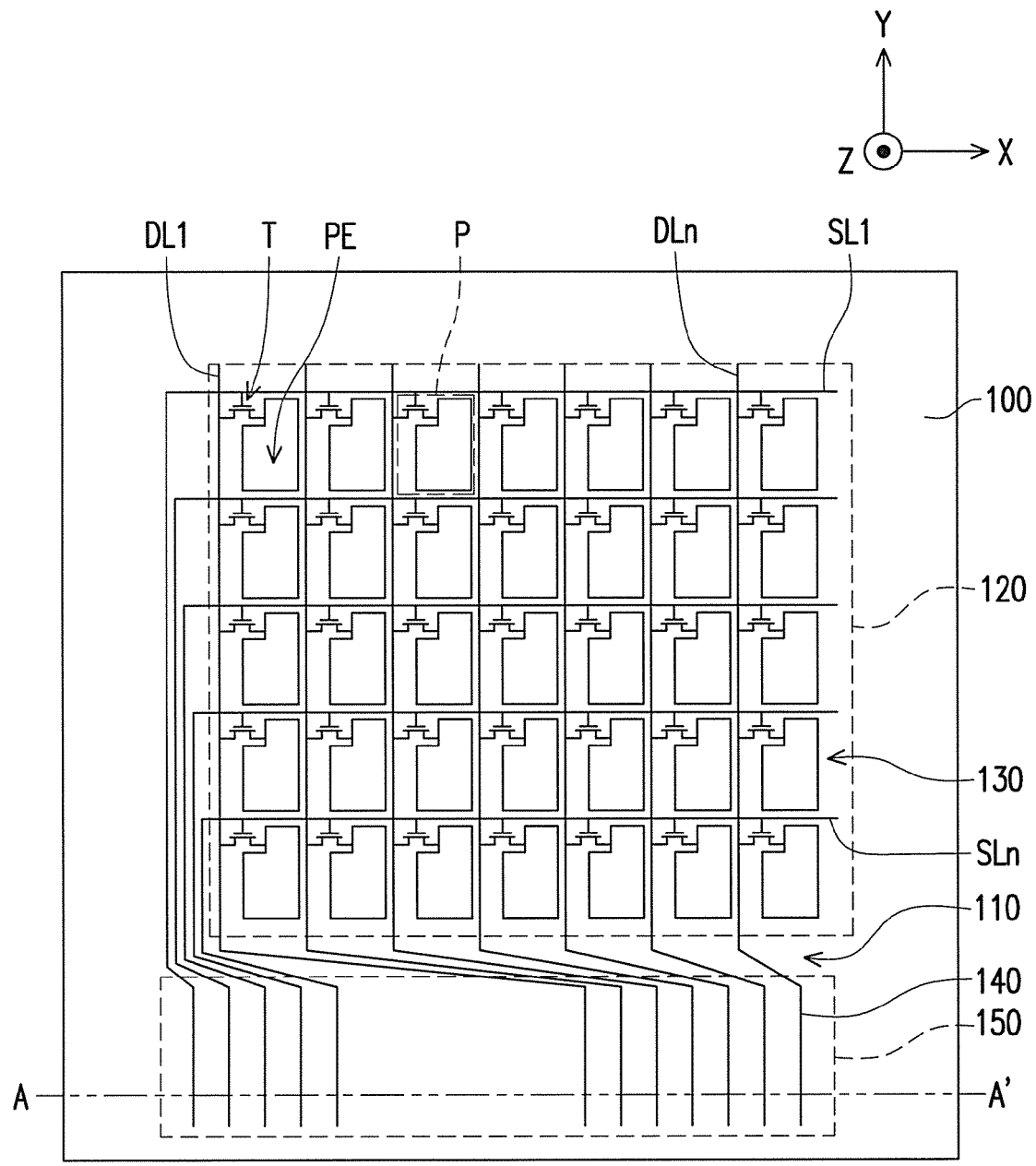
FIG. 1A to FIG. 1E are schematic top views illustrating a sealing method of a display panel according to an embodiment of the invention.
Figure 1B:
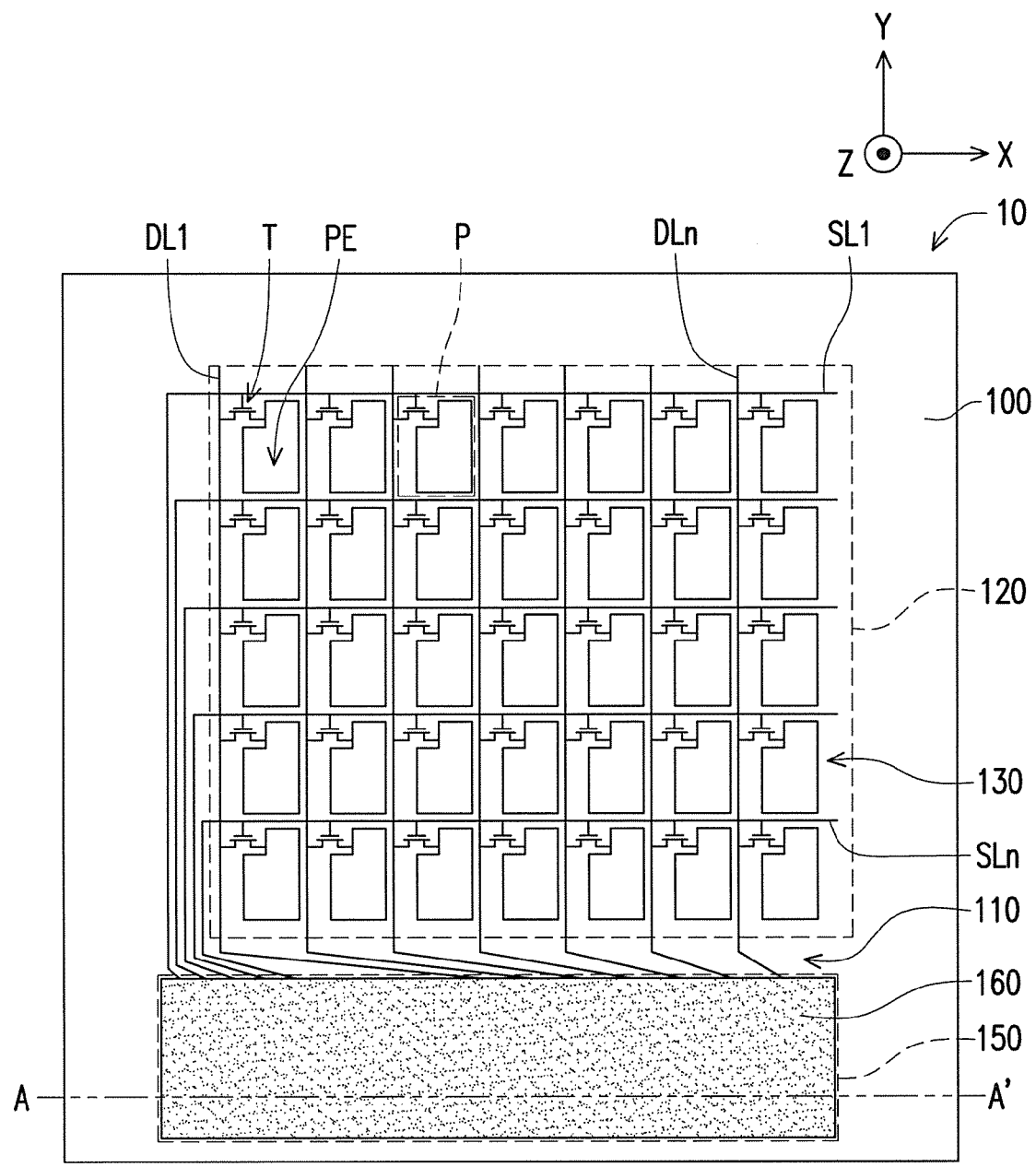
Figure 1C:
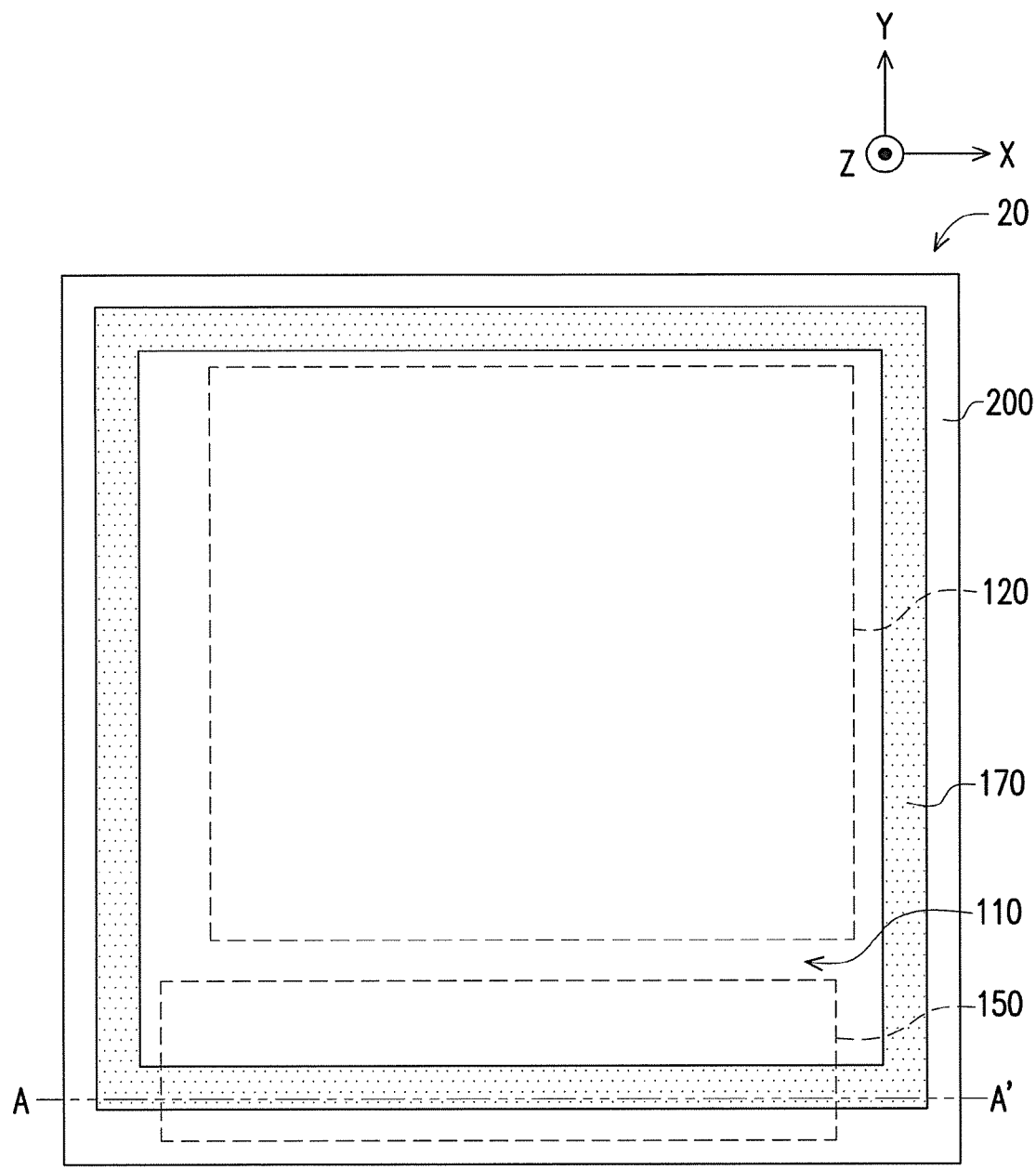

FIG. 1A to FIG. 1E are schematic top views illustrating a sealing method of a display panel according to an embodiment of the invention. FIG. 1F is a three-dimensional expanded view illustrating the display panel depicted in FIG. 1D and FIG. 1E. FIG. 2A to FIG. 2D and FIG. 2F are schematic cross-sectional views taken along a line A-A' depicted in FIG. 1A to FIG. 1E, and FIG. 2E is a schematic cross-sectional view taken along a line B-B' depicted in FIG. 1D.

Figure 1D:
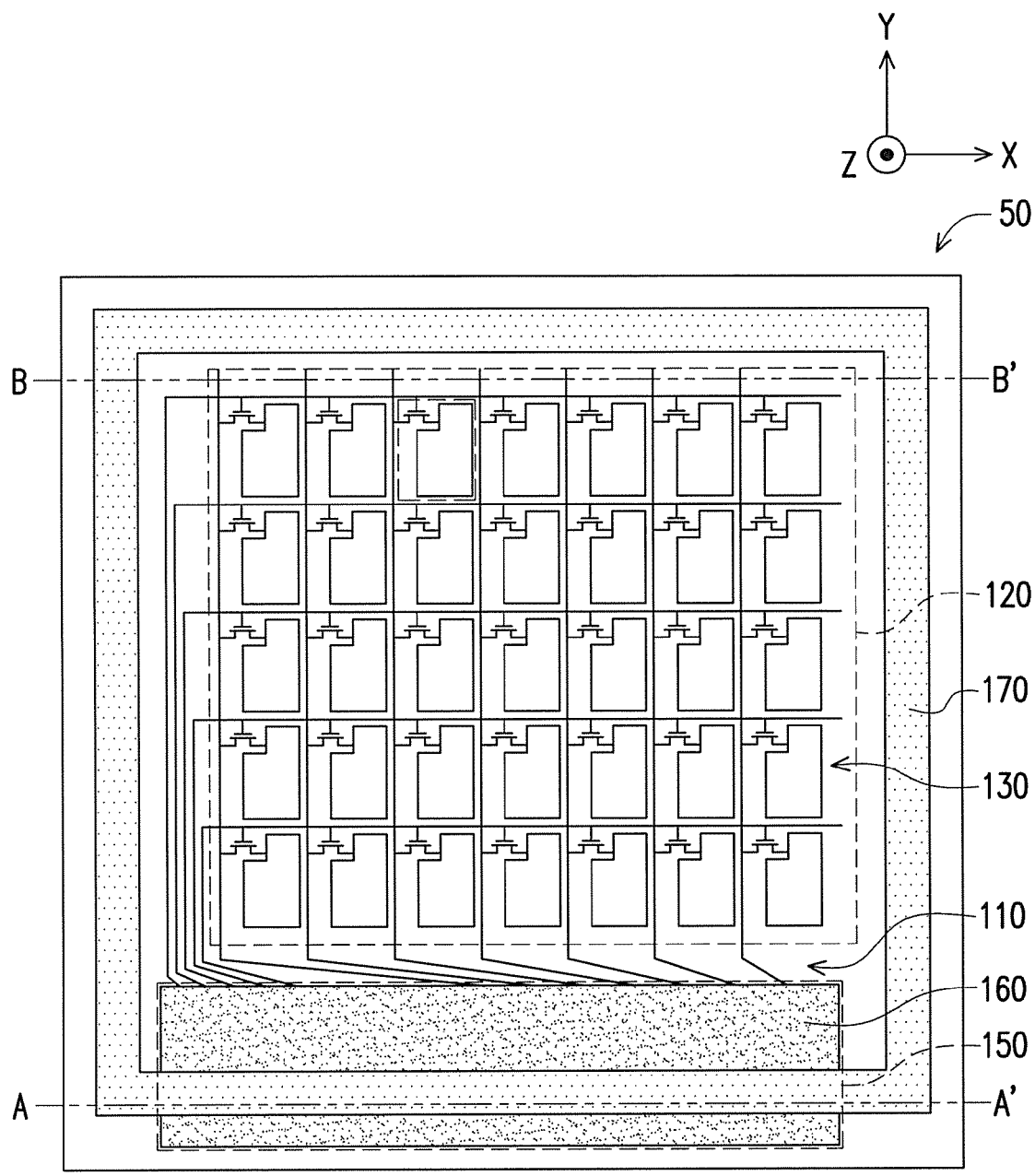

The display panel 50 shown in FIG. 1D has a display area 120 and a non-display area 110 that surrounds the display area 120. In an embodiment of the invention, the display panel 50 is an LCD panel, an OLED display panel, an EPD panel, a PDP, or any other display panel, for instance. The sealing method of the display panel 50 includes following steps.

Figure 2A:
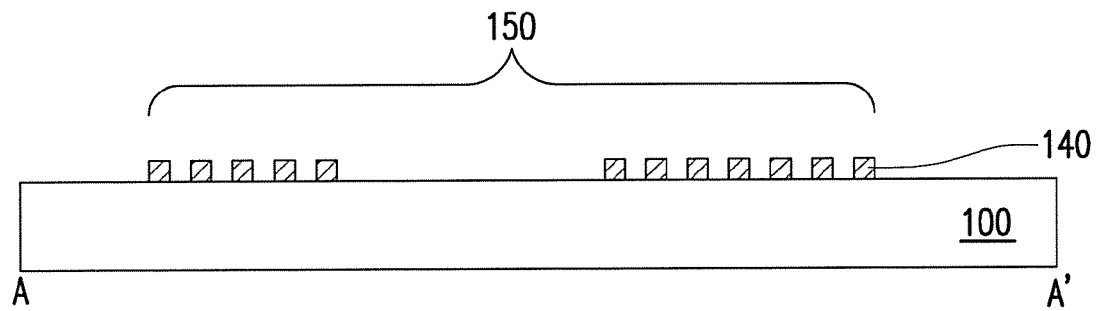
FIG. 2A to FIG. 2D and FIG. 2F are schematic cross-sectional views taken along a line A-A' depicted in FIG. 1A to FIG. 1E.

With reference to FIG. 1A and FIG. 2A, a substrate 100 is provided. The substrate 100 is, for instance, a pixel array substrate. To be specific, a pixel array 130 is formed in the display area 120 of the substrate 100. According to the present embodiment, the pixel array 130 includes a plurality of scan lines SL1 to SLn, a plurality of data lines DL1 to DLn, and a plurality of pixel structures P.

The scan lines SL1 to SLn and the data lines DL1 to DLn are alternately arranged, and an insulation layer (not shown) is sandwiched between the scan lines SL1 to SLn and the data lines DL1 to DLn. In other words, extension directions of the data lines DL1 to DLn are not parallel to extension directions of the scan lines SL1 to SLn; preferably, the extension directions of the data lines DL1 to DLn (i.e., along the x-axis direction) are perpendicular to the extension directions of the scan lines SL1 to SLn (i.e., along the y-axis direction). In consideration of electrical conductivity, the data lines DL1 to DLn and the scan lines SL1 to SLn are often made of metal materials. However, the invention is not limited thereto, and the scan lines SL1 to SLn and the data lines DL1 to DLn may be made of other conductive materials, such as alloy, metal nitride, metal oxide, metal oxynitride, any other appropriate material, or a stacked layer constituted by a metal material and other conductive materials.

Each of the pixel structures P includes an active device T and a pixel electrode PE. The active device T may be a bottom-gate thin film transistor (TFT) or a top-gate TFT, and the active device T includes a gate, a channel, a source, and a drain. The active device T is electrically connected to a corresponding one of the scan lines SL1 to SLn and a corresponding one of the data lines DL1 to DLn. Besides, the active device T is electrically connected to the pixel electrode PE.

The substrate 100 further includes a plurality of lead lines 140, and the lead lines 140 are formed in a lead line region 150 in the non-display area 110 of the substrate 100. Each lead line 140 is electrically connected to one of the scan lines SL1 to SLn or one of the data lines DL1 to DLn. In an embodiment of the invention, the lead lines 140 may be extended form the scan lines SL1 to SLn or the data lines DL1 to DLn to the lead line region 150 in the non-display area 110, and the lead lines 140 and the scan lines SL1 to SLn or the data lines DL1 to DLn may be made of the same material or different materials. In another embodiment of the invention, the lead lines 140 are not formed together with the scan lines SL1 to SLn or the data lines DL1 to DLn, and the lead lines 140 and the scan lines SL1 to SLn or the data lines DL1 to DLn may be made of the same material or different materials. The lead lines 140 in the lead line region 150 serve to be electrically connected to driver devices (not shown).

Figure 2B:
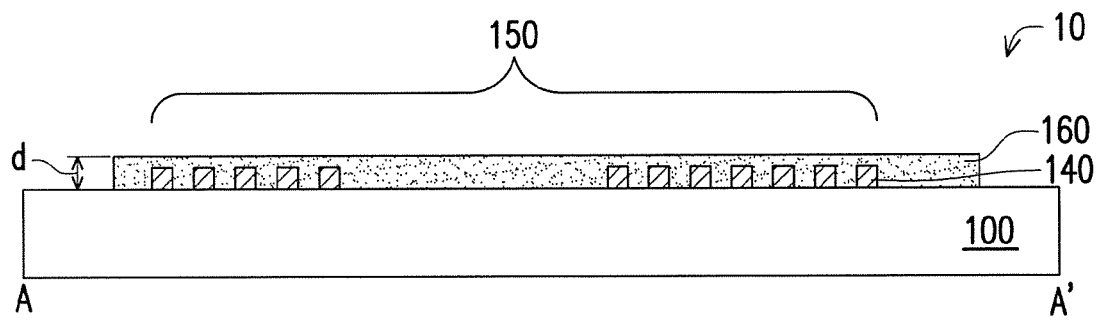

With reference to FIG. 1B and FIG. 2B, an absorption material layer 160 (with a thickness d) is formed in the non-display area 110 of the substrate 100. Therefore, the first substrate 10 includes the substrate 100, the pixel array 130, the lead lines 140, and the absorption material layer 160. The absorption material layer 160 is highly capable of absorbing the laser beam and may be made of metal silicide, metal oxide, metal nitride, an organic compound, a group IIIA-VA compound, or any other material highly capable of absorbing the laser beam; however, the invention is not limited thereto. In another embodiment of the invention, the material of the absorption material layer 160 may be one of the absorption materials listed in the following Table 1 and Table 2. According to an embodiment of the invention, a method of forming the absorption material layer 160 includes steps of performing chemical vapor deposition (CVD) or physical vapor deposition (PVD) and then performing photolithography and etching to define the absorption material layer 160, whereas the invention is not limited thereto. The absorption material layer 160 may also be formed in a different manner.

In an embodiment of the invention, the absorption material layer 160 covers the lead lines 140, and the absorption material layer 160 is configured in the lead line region 150 of the first substrate 10 where the leads lines 140 are located. Note that the patterns or the shape of the absorption material layer 160 is not limited in the invention. In other embodiments of the invention, as shown in FIG. 3A to FIG. 3D, the patterns of the absorption material layer 160 may have a net-like shape or a stripe shape, so as to selectively cover the lead lines 140. However, the invention is not limited thereto, and the patterns of the absorption material layer 160 may have a linear shape, a rectangular shape, a square shape, a triangular shape, a circular shape, an elliptic shape, any other shape, or a combination thereof. Here, the patterned absorption material layer 160 may selectively protect the underlying lead lines and other devices and may also expand the effective area for performing the laser sealing process. Thereby, the sealing strength may be enhanced.

Figure 2C:
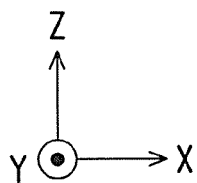
Figure 2C:
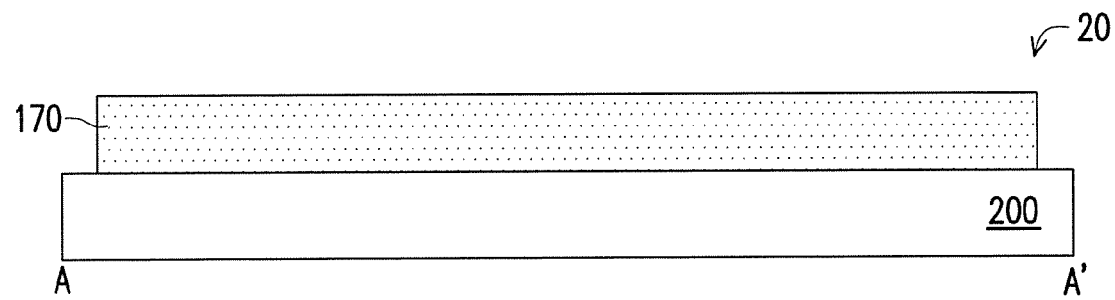

With reference to FIG. 1C and FIG. 2C, another substrate 200 is provided. The substrate 200 is, for instance, a blank glass cover, another transparent cover, or a substrate where conductive lines or other devices are formed. A sealing material layer 170 is configured in the non-display area 110 of the substrate 200. Hence, the second substrate 20 includes the substrate 200 and the sealing material layer 170. In an embodiment of the invention, the sealing material layer includes glass frit.

Figure 2D:
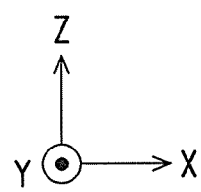
Figure 2D:
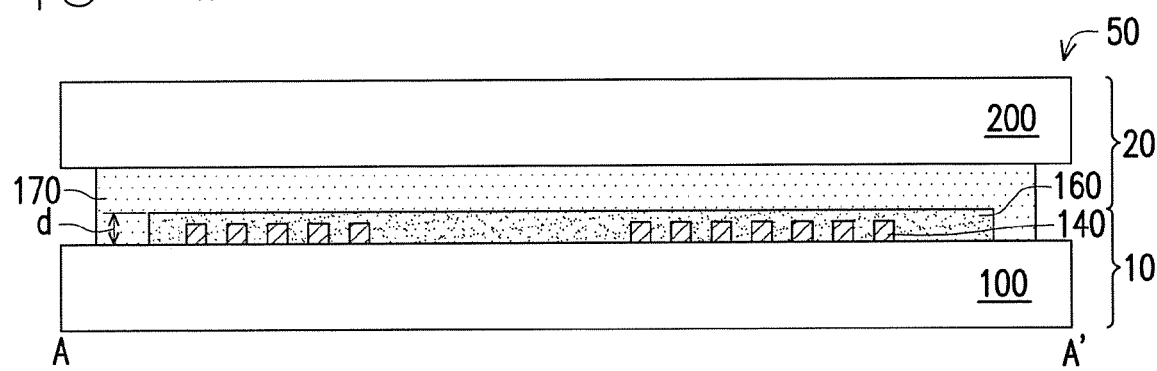
Figure 2E:
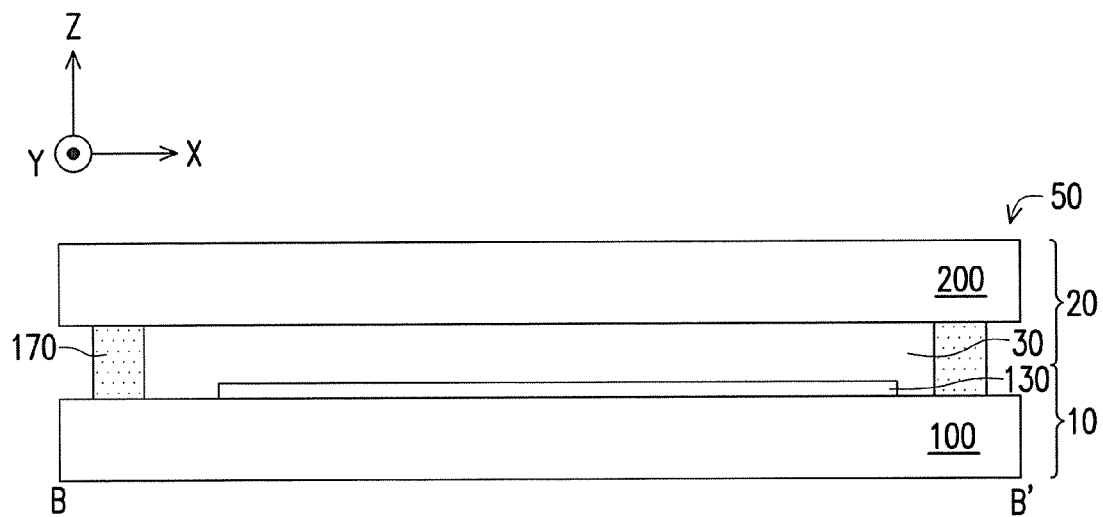
FIG. 2E is a schematic cross-sectional view taken along a line B-B' depicted in FIG. 1D.

With reference to FIG. 1D, FIG. 2D, and FIG. 2E, the second substrate 20 and the first substrate 10 are assembled, and a display medium 30 is formed therebetween. The absorption material layer 160 and the sealing material layer 170 at least partially overlap. Specifically, the sealing material layer 170 of the second substrate 20 described herein is at least partially overlapped with the absorption material layer 160 in a vertical projection direction. The vertical projection direction is along the z-axis direction, and the z-axis direction is perpendicular to a plane defined by the x axis and the y axis (i.e., the plane constituted by the scan lines SL1 to SLn and the data lines DL1 to DLn or the first substrate). Besides, the first and second substrates 10 and 20 may be assembled by lamination, so that the sealing material layer 170 of the second substrate 20 is in contact with the substrate 100 and the absorption material layer 160 of the first substrate 10. When the display panel 50 is an LCD panel, the display medium 30 refers to liquid crystal molecules, for instance. If the display panel 50 is an OLED panel, the display medium 30 refers to an organic light-emitting layer, for instance. If the display panel 50 is an EPD panel, the display medium 30 refers to an electrophoresis display medium, for instance. If the display panel 50 is a PDP, the display medium 30 refers to a plasma display medium, for instance.

Figure 1E:
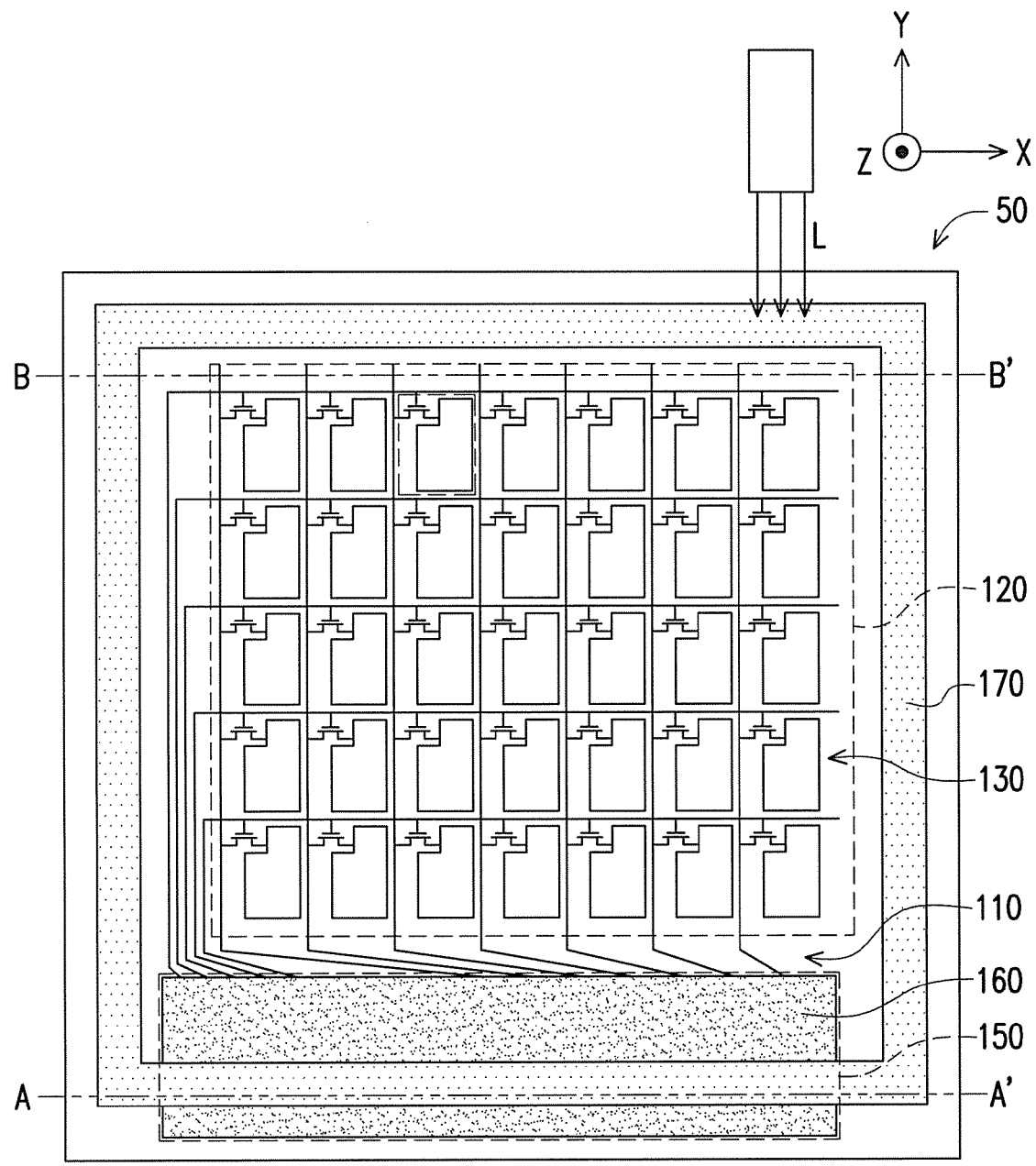
Figure 1F:
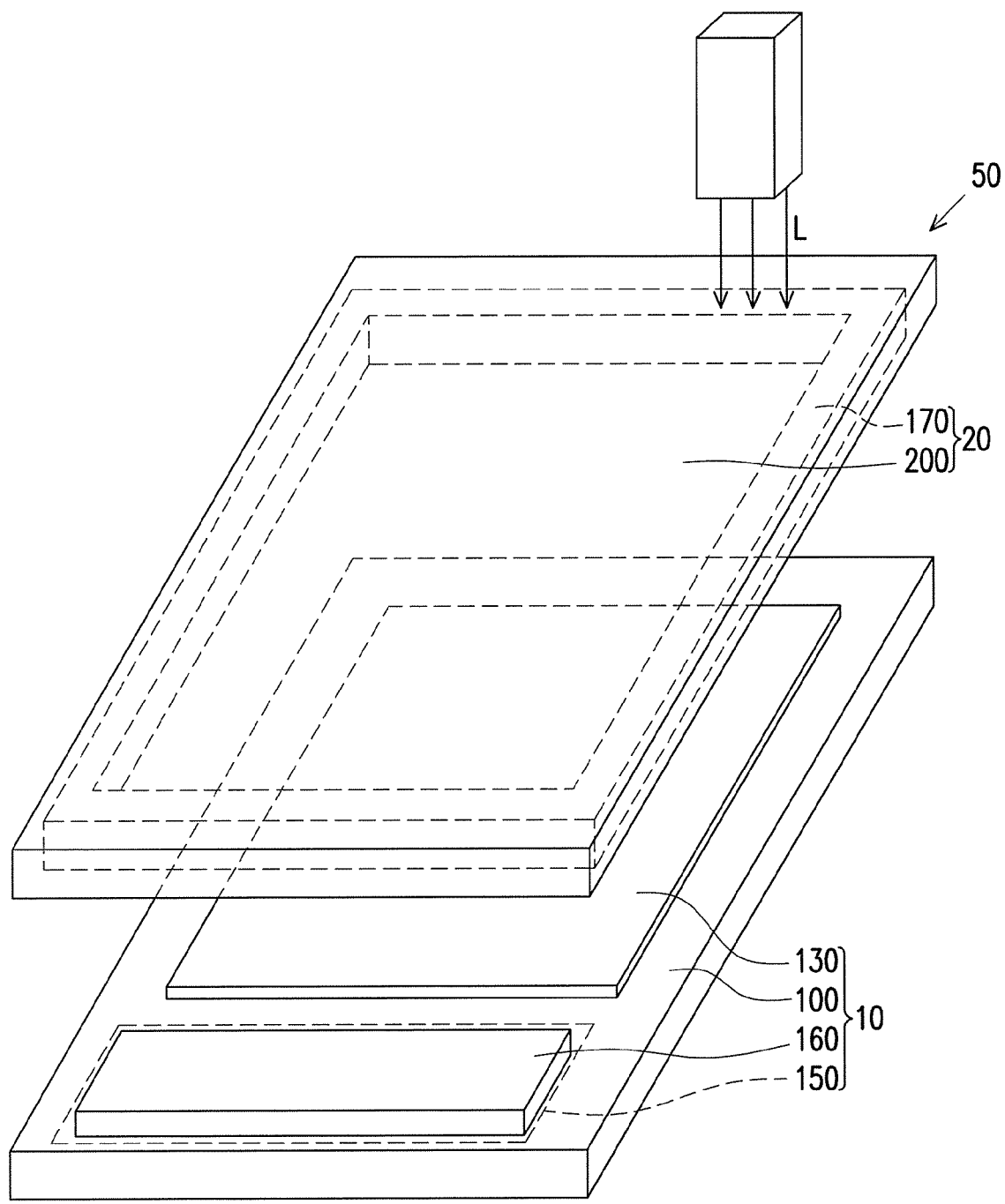
FIG. 1F is a three-dimensional expanded view illustrating the display panel depicted in FIG. 1D and FIG. 1E.
Figure 2F:
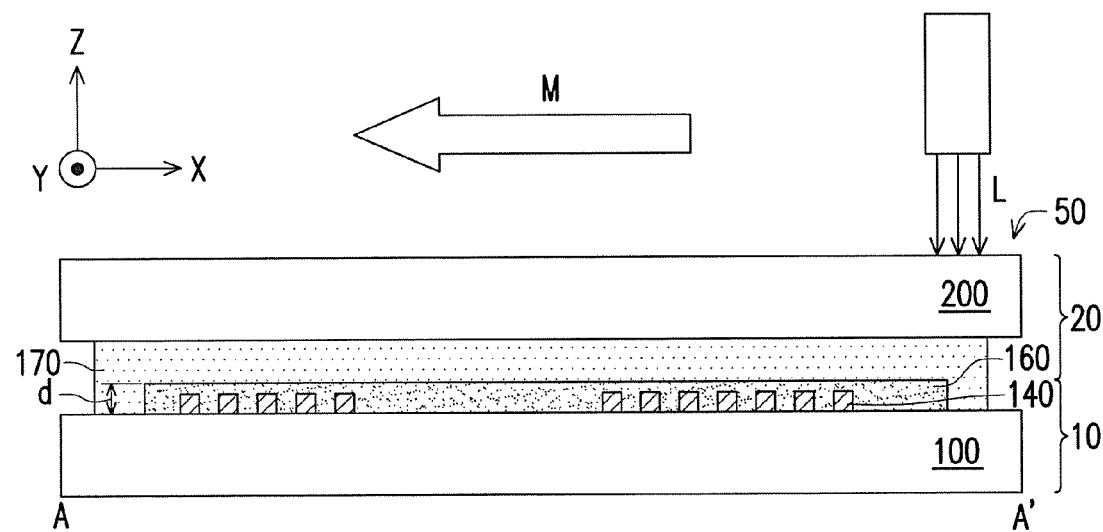
Figure 3A:
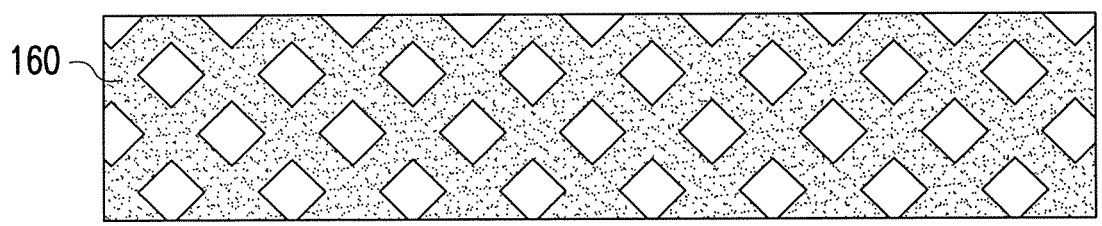
FIG. 3A to FIG. 3D are schematic top views illustrating patterns of a patterned absorption material layer according to other embodiments of the invention.
Figure 3B:
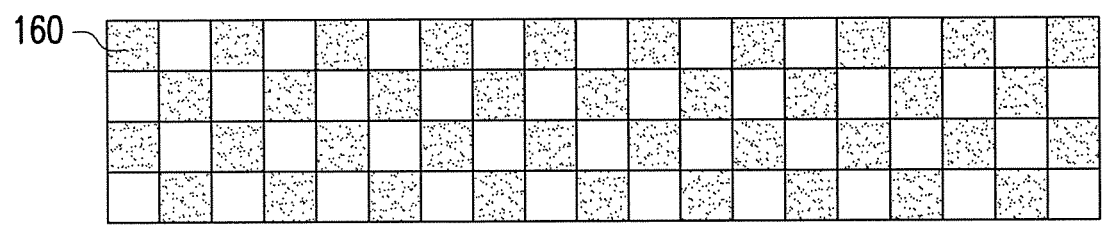
Figure 3C:
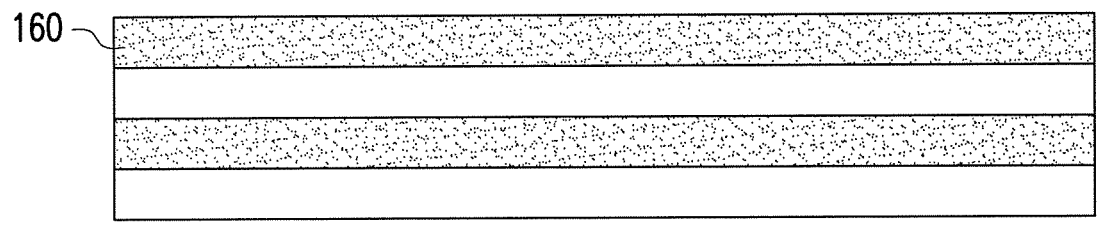
Figure 3D:
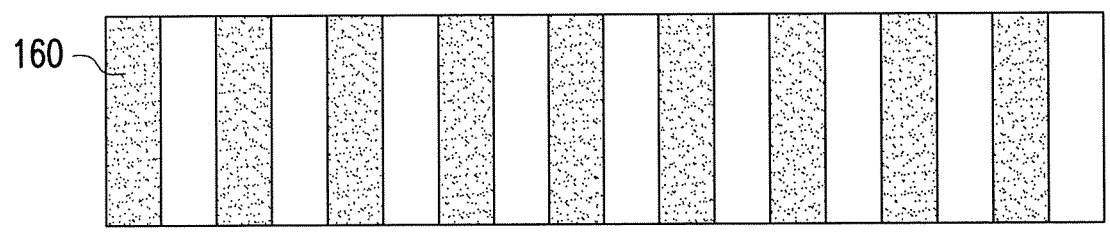

With reference to FIG. 1E, FIG. 1F, and FIG. 2F, a laser processing process is performed on the sealing material layer 170 of the second substrate 20, such that the first substrate 10 and the second substrate 20 are adhered by the sealing material layer 170. A moving direction M of a laser beam L in the laser processing process is along the sealing material layer 170. In an embodiment of the invention, the laser processing process is a laser sintering process, for instance. A wavelength of the laser beam L in the laser processing process ranges from about 800 nm to about 1100 nm, for instance. Particularly, after the laser beam L passing through the sealing material layer 170 in the laser processing process, the absorption material layer 160 absorbs a portion of the laser beam L passing through the sealing material layer 170. Thereby, the portion of the laser beam L passing through the sealing material layer 170 (i.e., the portion of the laser beam L which is not absorbed by the sealing material layer 170) is absorbed by the absorption material layer 160 and is thus not reflected by the lead lines 140, so as to prevent damages to the structure of the sealing material layer 170.

As is discussed above, the absorption material layer 160 is located in the lead line region 150, which should however not be construed as a limitation to the invention. In other embodiments of the invention, the absorption material layer 160 may be arranged in a different manner, which will be elaborated hereinafter.

Figure 4:
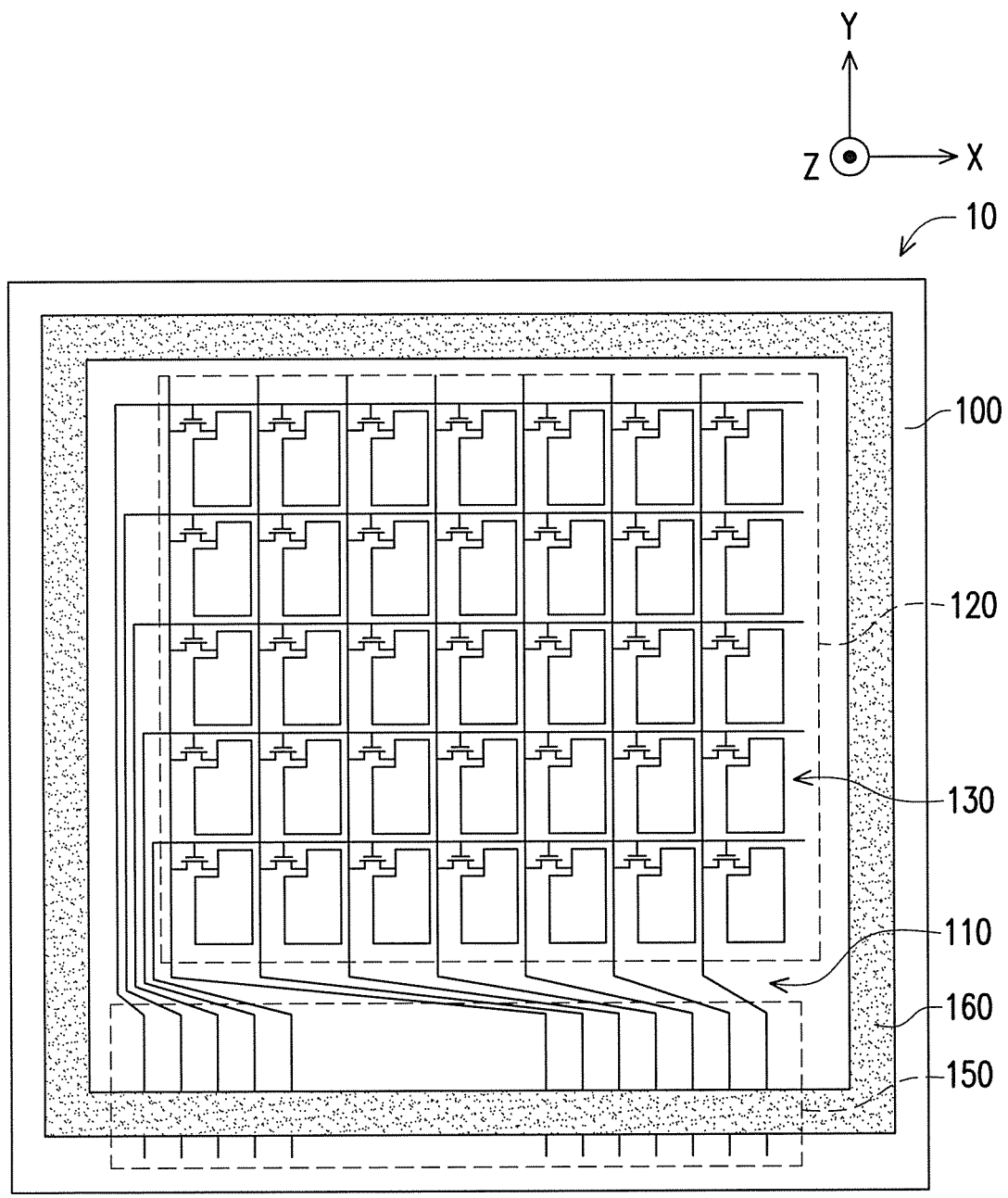
FIG. 4 is a schematic top view illustrating a first substrate according to another embodiment of the application.
Figure 5A:
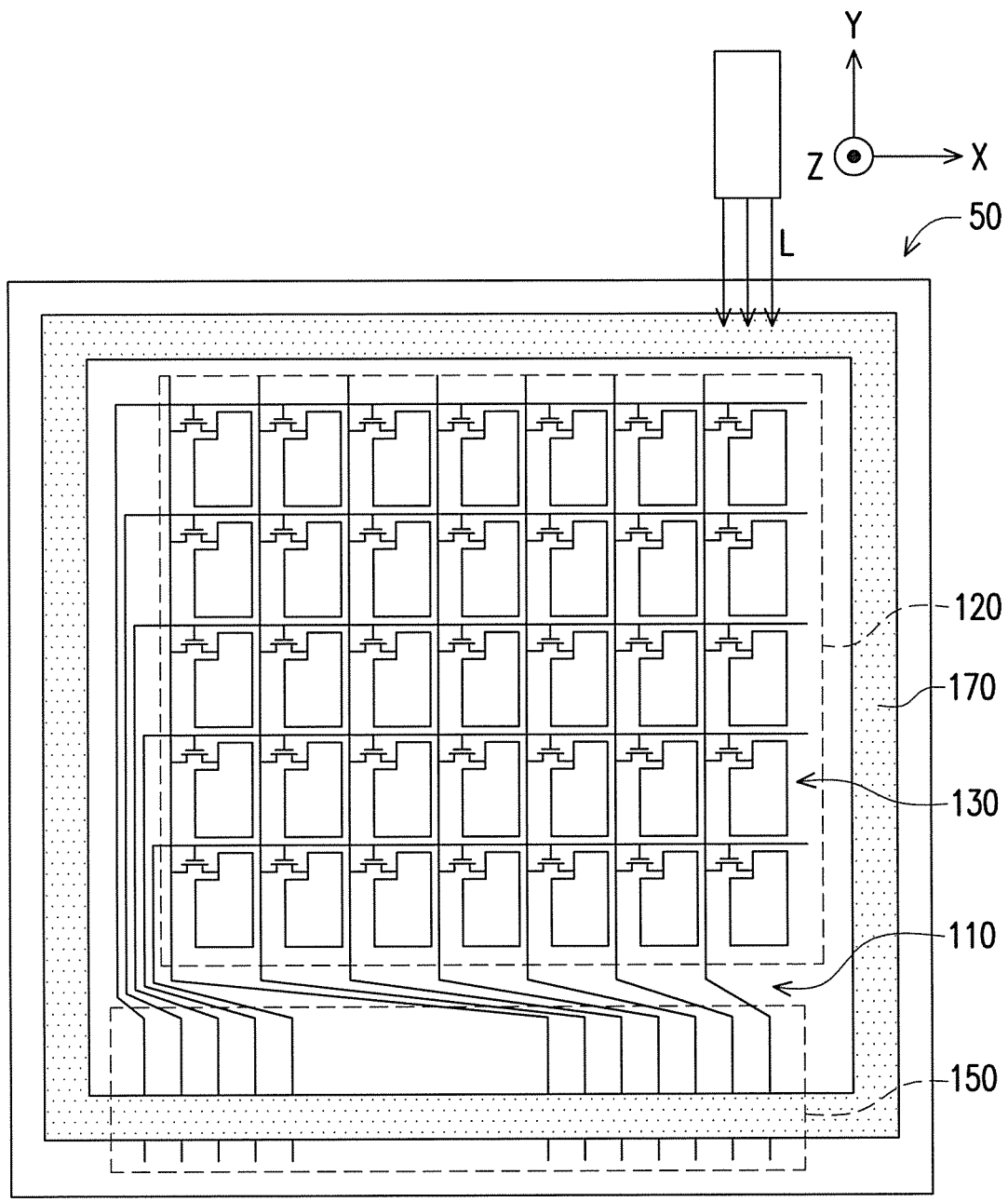
FIG. 5A is a top view illustrating a display panel having the first substrate depicted in FIG. 4.
Figure 5B:
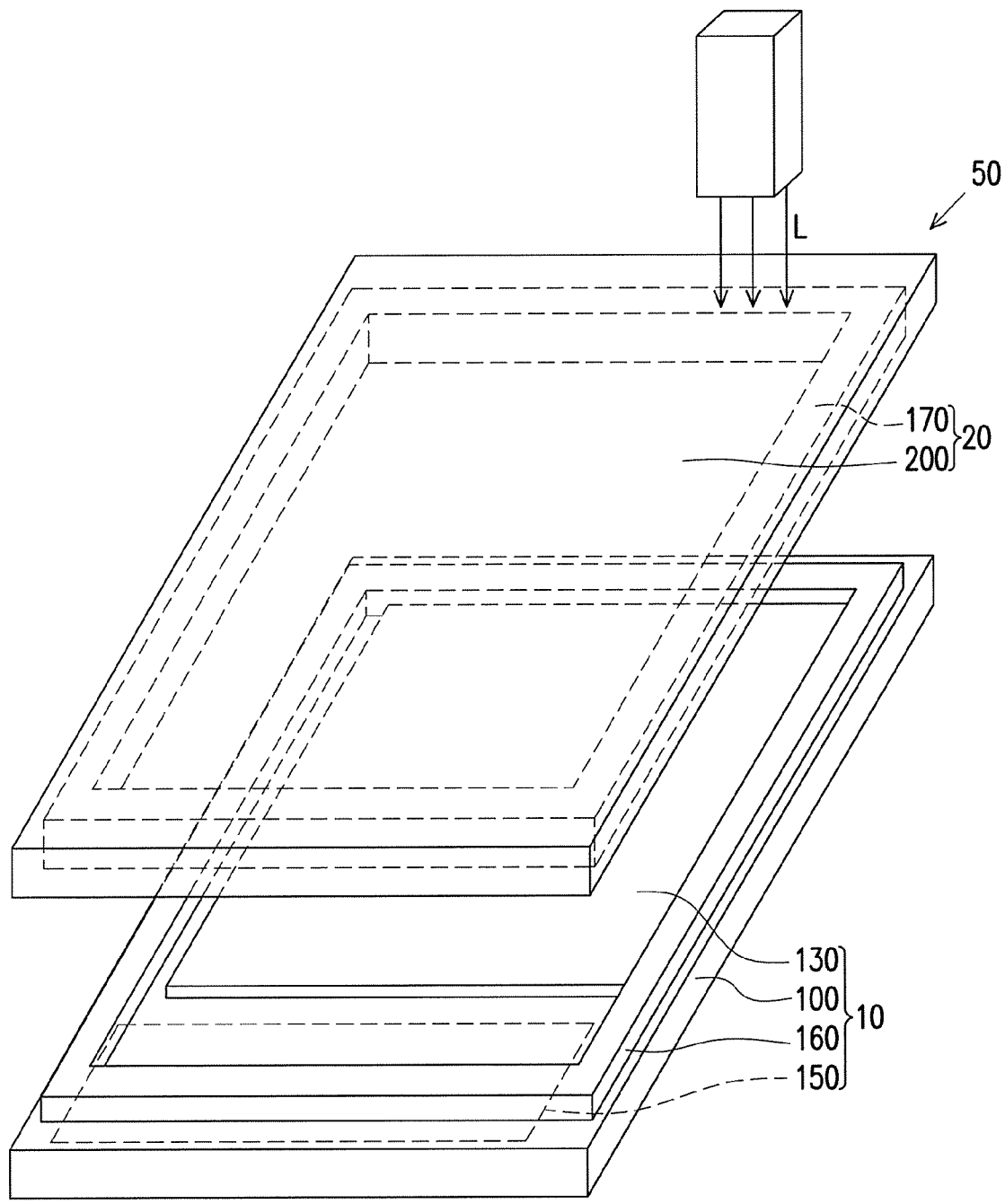
FIG. 5B is a three-dimensional expanded view illustrating the display panel depicted in FIG. 5A.

FIG. 4 is a schematic top view illustrating a first substrate according to another embodiment of the application. FIG. 5A is a top view illustrating a display panel having the first substrate depicted in FIG. 4. FIG. 5B is a three-dimensional expanded view illustrating the display panel depicted in FIG. 5A. With reference to FIG. 4, FIG. 5A, and FIG. 5B, the embodiment shown herein is similar to the embodiment shown in FIG. 1E, so that identical components in these figures will be denoted by the same numerals and will not be reiterated herein. The difference between the embodiment shown in FIG. 4, FIG. 5A, and FIG. 5B and the embodiment shown in FIG. 1E lies in that the sealing material layer 170 of the second substrate 20 described herein is completely overlapped with the absorption material layer 160 in a vertical projection direction. That is, in the present embodiment, the patterns of the absorption material layer 160 are almost the same as those of the sealing material layer 170, and the absorption material layer 160 and the sealing material layer 170 overlap. Therefore, as shown in FIG. 5A and FIG. 5B, when the first substrate 10 and the second substrate 20 are assembled to form the display panel 50, the sealing material layer 170 completely covers the absorption material layer 160. As such, the absorption material layer 160 may prevent the damages to the structure of the sealing material layer 170 caused by the laser beam reflected by the metal lead lines in the lead line region 150 and protect devices in the regions other than the lead line region from being affected by laser.

Figure 6:
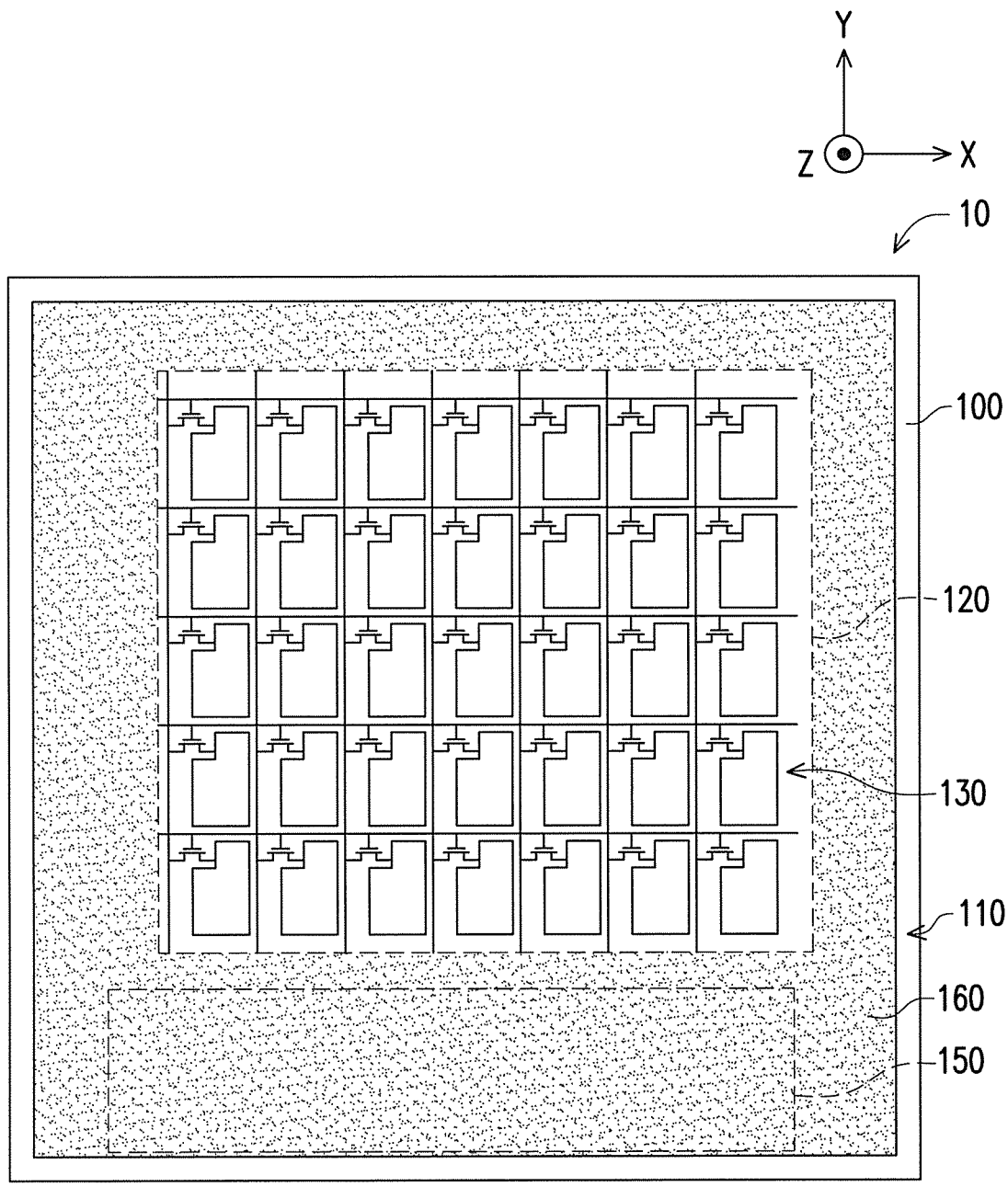
FIG. 6 is a schematic top view illustrating a first substrate according to another embodiment of the application.
Figure 7A:
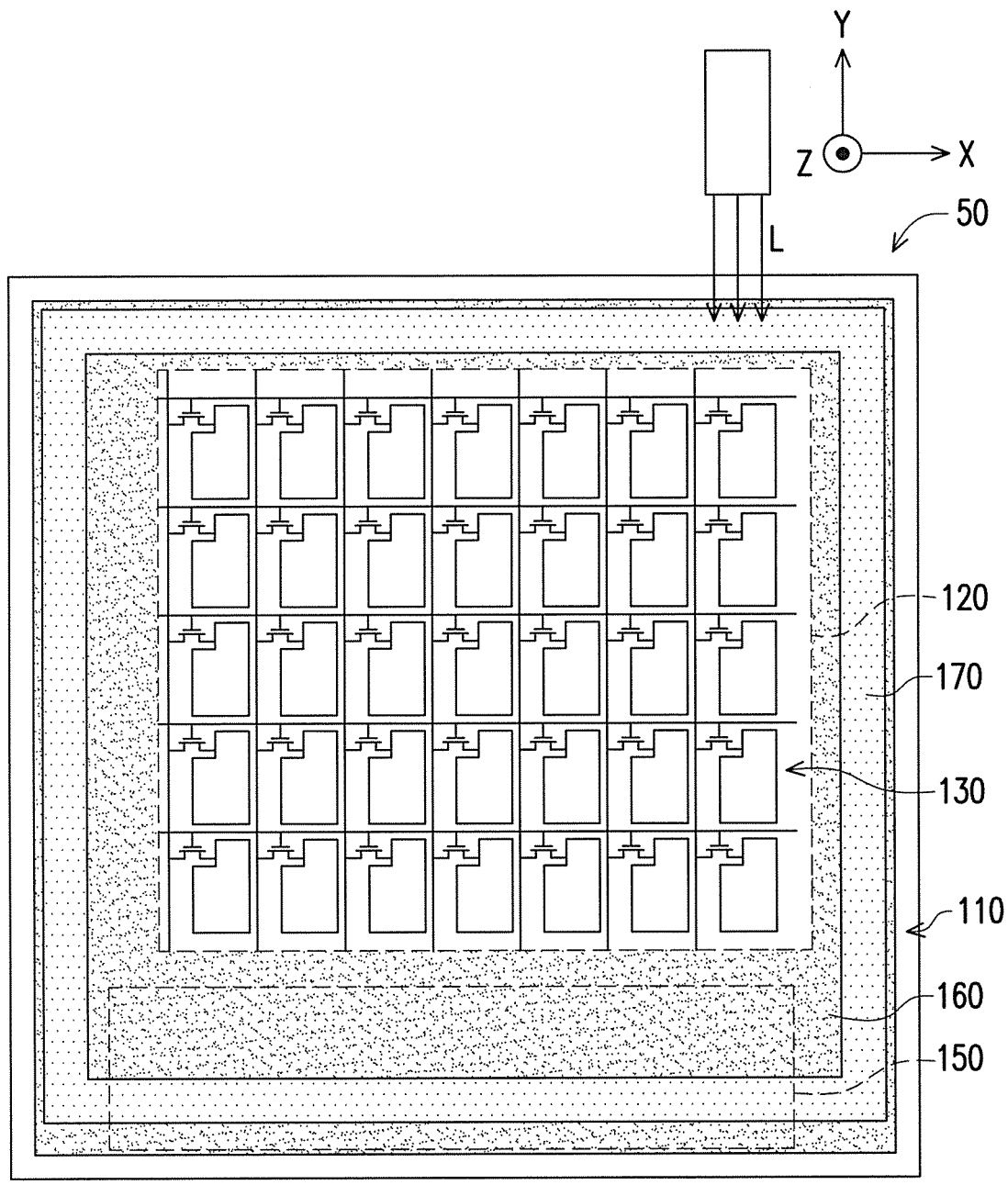
FIG. 7A is a top view illustrating a display panel having the first substrate depicted in FIG. 6.
Figure 7B:
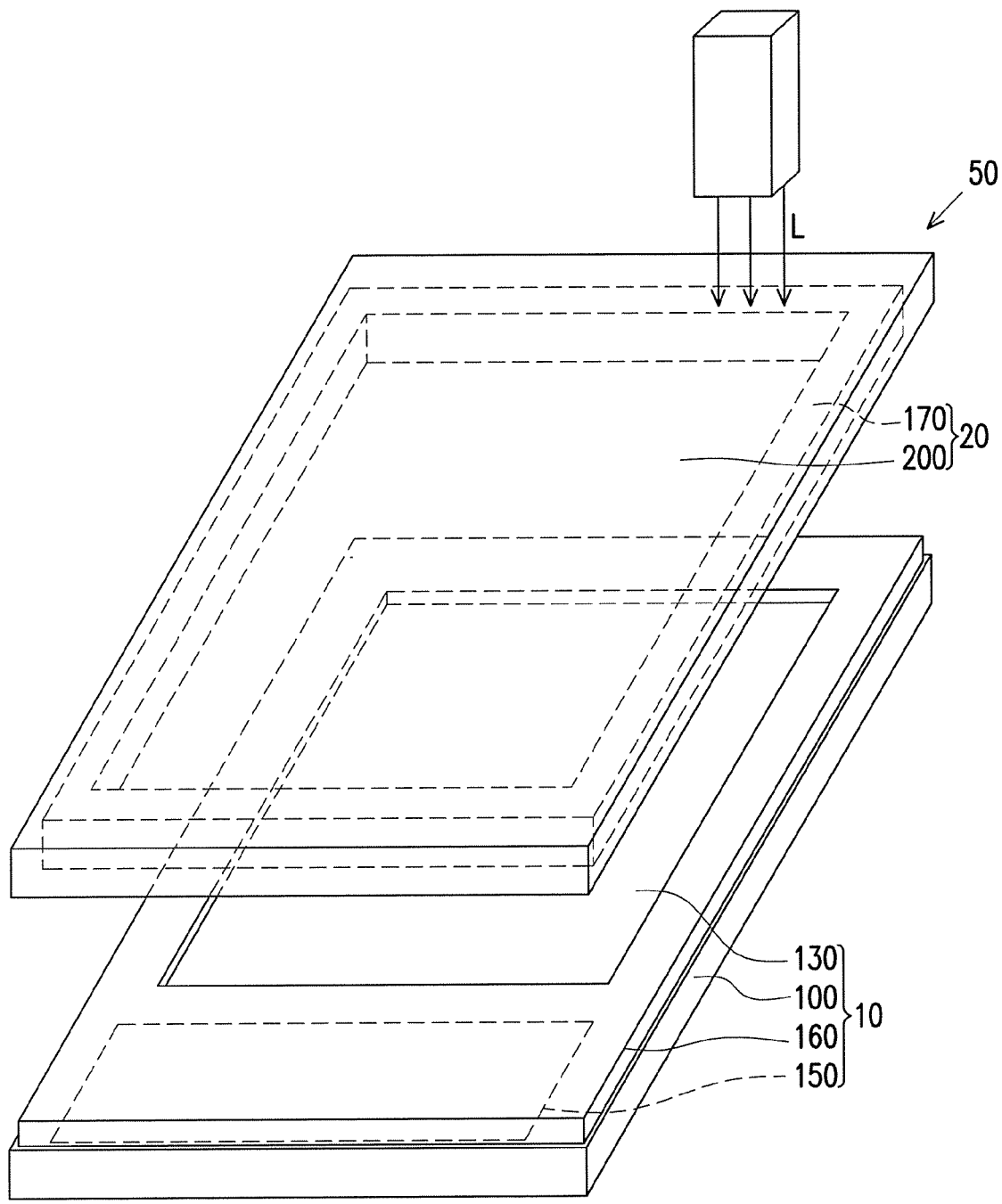
FIG. 7B is a three-dimensional expanded view illustrating the display panel depicted in FIG. 7A.

FIG. 6 is a schematic top view illustrating a first substrate according to another embodiment of the application. FIG. 7A is a top view illustrating a display panel having the first substrate depicted in FIG. 6. FIG. 7B is a three-dimensional expanded view illustrating the display panel depicted in FIG. 7A. With reference to FIG. 6, FIG. 7A, and FIG. 7B, the embodiment shown herein is similar to the embodiment shown in FIG. 1E, so that identical components in these figures will be denoted by the same numerals and will not be reiterated herein. The difference between the embodiment shown in FIG. 6, FIG. 7A, and FIG. 7B and the embodiment shown in FIG. 1E lies in that the absorption material layer 160 described herein completely covers the non-display area 110 of the first substrate 10, and the sealing material layer 170 of the second substrate 20 is partially overlapped with the absorption material layer 160 in a vertical projection direction. Therefore, as shown in FIG. 7A and FIG. 7B, when the first substrate 10 and the second substrate 20 are assembled to form the display panel 50, the sealing material layer 170 and a portion of the absorption material layer 160 are overlapped. As such, the absorption material layer 160 may prevent the damages to the structure of the sealing material layer 170 caused by the laser beam reflected by the metal lead lines in the lead line region 150 and protect devices in the regions other than the lead line region from being affected by laser.

It can be learned from the embodiments depicted in FIG. 1D, FIG. 2D, FIG. 5A, and FIG. 7A that the display panel 50 has the display area 120 and the non-display area 110 that surrounds the display area 120. The display panel 50 includes the first substrate 10, the second substrate 20, and the display medium 30. The first substrate 10 includes the pixel array 130 and the absorption material layer 160, the pixel array 130 is located in the display area 120, and the absorption material layer 160 is located in the non-display area 110. The display panel 50 further includes the lead lines 140 that are located on the first substrate 10 and in the non-display area 110. The absorption material layer 160 covers the lead lines 140 and is arranged on the lead line region 150 of the first substrate 10 where the lead lines 140 are located. The second substrate 20 includes the sealing material layer 170 in the non-display area 110. The display medium 30 is sandwiched between the first substrate 10 and the second substrate 20.

According to several embodiments of the invention, in order to absorb the portion of the laser beam L passing through the sealing material layer 170, the absorption material layer 160 is made of an appropriate material which is highly capable of absorbing the laser beam, and the thickness d of the absorption material layer 160 is properly determined. The required thickness d of the absorption material layer 160 is obtained by the following Equations 1 to 3 according to the Lambert's law, which is described hereinafter.

$$\alpha = \frac{4\pi k}{\lambda} \quad \text{[Equation 1]}$$

In Equation 1, an absorption coefficient α of the absorption material is obtained by means of an extinction coefficient k of the absorption material and the wavelength λ of the laser beam L in the laser processing process.

$$I = I_0 \cdot e^{-\alpha \cdot d} \quad \text{[Equation 2]}$$

$$d = \frac{-\ln(I/I_0)}{\alpha} \quad \text{[Equation 3]}$$

Equation 3 is deduced from Equation 2. In Equation 3, the required thickness d of the absorption material layer 160 is obtained by means of the absorption coefficient α of the absorption material, an intensity $I_0$ of the laser beam passing through the sealing material layer 170, and an intensity I of the laser beam passing through the absorption material layer 160.

Since the laser beam L applied in the laser processing process is mostly absorbed by the sealing material layer 170, it is assumed that the intensity $I_0$ of the laser beam passing through the sealing material layer 170 is 0.5 times, 0.4 times, 0.3 times, 0.2 times, and 0.1 times the intensity of the laser beam L, and it is also assumed that the intensity I of the laser beam passing through the absorption material layer 160 is 0.01 times the intensity of the laser beam L. Based on the above assumptions, the required thickness d of the absorption material layer 160 may be obtained by means of the absorption coefficient α of the absorption material and Equation 3.

As shown in Table 1 and Table 2, when the wavelength λ of the laser beam L in the laser processing process is 808 nm and 940 nm, the same absorption material may have different absorption coefficients α. Besides, Table 1 and Table 2 respectively demonstrate the required thickness d of the absorption material layer 160 with different absorption materials on the condition that the intensity $I_0$ of the laser beam passing through the sealing material layer 170 is 0.5 times, 0.4 times, 0.3 times, 0.2 times, and 0.1 times the intensity of the laser beam L.

TABLE 1

| Absorption Material | Absorption Coefficient(cm$^{-1}$) | Required thickness d of Absorption Material Layer (μm) | | | | |
|---|---|---|---|---|---|---|
| | | $I_0$ = 0.5 times | $I_0$ = 0.4 times | $I_0$ = 0.3 times | $I_0$ = 0.3 times | $I_0$ = 0.1 times |
| GaSb | 5.73E+04 | 0.68 | 0.64 | 0.59 | 0.52 | 0.40 |
| InGaSb | 6.53E+04 | 0.60 | 0.56 | 0.52 | 0.46 | 0.35 |
| InSb | 1.06E+05 | 0.37 | 0.35 | 0.32 | 0.28 | 0.22 |
| AlGaAs | 1.34E+04 | 2.91 | 2.75 | 2.53 | 2.23 | 1.71 |
| InGaAs | 4.46E+04 | 0.88 | 0.83 | 0.76 | 0.67 | 0.52 |
| TiN | 5.95E+05 | 0.07 | 0.06 | 0.06 | 0.05 | 0.04 |
| CuO | 1.50E+04 | 2.60 | 2.46 | 2.26 | 1.99 | 1.53 |
| AlGaInP | 1.57E+04 | 2.49 | 2.35 | 2.16 | 1.91 | 1.46 |
| CoSi$_2$ | 2.76E+05 | 0.14 | 0.13 | 0.12 | 0.11 | 0.08 |
| Cr$_3$Si | 3.19E+05 | 0.12 | 0.12 | 0.11 | 0.09 | 0.07 |
| Cr$_3$Si$_3$ | 3.99E+05 | 0.10 | 0.09 | 0.09 | 0.08 | 0.06 |
| FeSi$_2$ | 3.71E+05 | 0.11 | 0.10 | 0.09 | 0.08 | 0.06 |
| HfSi$_2$ | 3.85E+05 | 0.10 | 0.10 | 0.09 | 0.08 | 0.06 |
| MoSi$_2$ | 3.46E+05 | 0.11 | 0.11 | 0.10 | 0.09 | 0.07 |
| NbSi | 4.03E+05 | 0.10 | 0.09 | 0.08 | 0.07 | 0.06 |
| NiSi | 3.93E+05 | 0.10 | 0.09 | 0.09 | 0.08 | 0.06 |
| Ni$_2$Si | 4.71E+05 | 0.08 | 0.08 | 0.07 | 0.06 | 0.05 |
| Ni$_3$Si | 6.22E+05 | 0.06 | 0.06 | 0.05 | 0.05 | 0.04 |
| Pd$_2$Si | 5.33E+05 | 0.07 | 0.07 | 0.06 | 0.06 | 0.04 |
| ReSi | 1.84E+05 | 0.21 | 0.20 | 0.18 | 0.16 | 0.13 |
| TaSi$_2$ | 3.20E+05 | 0.12 | 0.12 | 0.11 | 009 | 0.07 |
| TiSi | 4.64E+05 | 0.08 | 0.08 | 0.07 | 0.06 | 0.05 |
| VSi$_2$ | 4.17E+05 | 0.09 | 0.09 | 0.08 | 0.07 | 0.06 |
| HgTe | 1.03E+05 | 0.38 | 0.36 | 0.33 | 0.29 | 0.22 |
| AlSi | 1.03E+06 | 0.04 | 0.04 | 0.03 | 0.03 | 0.02 |
| AlSiTi | 1.02E+06 | 0.04 | 0.04 | 0.03 | 0.03 | 0.02 |
| HgCdTe | 1.03E+05 | 0.38 | 0.36 | 0.33 | 0.29 | 0.22 |
| In$_2$O$_3$—SnO$_2$ | 1.22E+04 | 3.20 | 3.02 | 2.78 | 2.45 | 1.89 |

From Table 1, it can be observed that when the wavelength λ of the laser beam L in the laser processing process is about 808 nm, the absorption coefficient α of the absorption material layer 160 ranges from about 1.22E+4 cm$^{-1}$ to about 1.03E+6 cm$^{-1}$, and the required thickness d of the absorption material layer 160 ranges from about 0.02 μm to about 3.2 μm. Preferably, the absorption coefficient α of the absorption material layer 160 ranges from about 1.34E+4 cm$^{-1}$ to about 1.03E+6 cm$^{-1}$, and the required thickness d of the absorption material layer 160 ranges from about 0.02 μm to about 2.91 μm.

TABLE 2

| Absorption Material | Absorption Coefficient(cm$^{-1}$) | Required thickness d of Absorption Material Layer (μm) | | | | |
|---|---|---|---|---|---|---|
| | | $I_0 = 0.5$ times | $I_0 = 0.4$ times | $I_0 = 0.3$ times | $I_0 = 0.3$ times | $I_0 = 0.1$ times |
| GaSb | 3.72E+04 | 1.05 | 0.99 | 0.91 | 0.80 | 0.62 |
| AlGaAs | 1.22E+04 | 3.22 | 3.03 | 2.80 | 2.46 | 1.89 |
| AlGaInP | 1.09E+04 | 3.59 | 3.38 | 3.12 | 2.75 | 2.11 |
| CoSi$_2$ | 3.12E+05 | 0.13 | 0.12 | 0.11 | 0.10 | 0.07 |
| Cr$_3$Si | 3.02E+05 | 0.13 | 0.12 | 0.11 | 0.10 | 0.08 |
| Cr$_3$Si$_3$ | 3.58E+05 | 0.11 | 0.10 | 0.09 | 0.08 | 0.06 |
| FeSi$_2$ | 2.74E+05 | 0.14 | 0.13 | 0.12 | 0.11 | 0.08 |
| HfSi$_2$ | 3.25E+05 | 0.12 | 0.11 | 0.10 | 0.09 | 0.07 |
| MoSi$_2$ | 2.70E+05 | 0.14 | 0.14 | 0.13 | 0.11 | 0.09 |
| NbSi | 3.04E+05 | 0.13 | 0.12 | 0.11 | 0.10 | 0.08 |
| NiSi | 3.24E+05 | 0.12 | 0.11 | 0.10 | 0.09 | 0.07 |
| Ni$_2$Si | 4.38E+05 | 0.09 | 0.08 | 0.08 | 0.07 | 0.05 |
| Ni$_3$Si | 6.09E+05 | 0.06 | 0.06 | 0.06 | 0.05 | 0.04 |
| Pd$_2$Si | 4.92E+05 | 0.08 | 0.07 | 0.07 | 0.06 | 0.05 |
| ReSi | 1.38E+05 | 0.28 | 0.27 | 0.25 | 0.22 | 0.17 |
| TaSi$_2$ | 2.75E+05 | 0.14 | 0.13 | 0.12 | 0.11 | 0.08 |
| TiSi | 4.11E+05 | 0.10 | 0.09 | 0.08 | 0.07 | 0.06 |
| VSi$_2$ | 3.70E+05 | 0.11 | 0.10 | 0.09 | 0.08 | 0.06 |

From Table 2, it can be observed that when the wavelength λ of the laser beam L in the laser processing process is about 940 nm, the absorption coefficient α of the absorption material layer 160 ranges from about 1.09E+4 cm$^{-1}$ to about 6.09E+5 cm$^{-1}$, and the required thickness d of the absorption material layer 160 ranges from about 0.04 μm to about 3.59 μm. Preferably, the absorption coefficient α of the absorption material layer 160 ranges from about 1.38E+5 cm$^{-1}$ to about 6.09E+5 cm$^{-1}$, and the required thickness d of the absorption material layer 160 ranges from about 0.04 μm to about 0.28 μm.

To sum up, in the display panel and the sealing method thereof, the absorption material layer highly capable of absorbing the laser beam is formed in the metal lead line region of the pixel array substrate. The sealing material layer on the cover substrate may be partially or completely overlapped with the absorption material layer in the vertical projection direction. Since the absorption material layer absorbs a portion of the laser beam passing through the sealing material layer (i.e., the portion of the laser beam that is not absorbed by the frit), the issues of overly sintered and unevenly heated frit arising from the reflection of the laser beam by metal lead lines may be resolved, and thus the damages to the structure of the frit and the unfavorable sealing effects may be prevented. As a result, the display panel and the sealing method thereof described herein are characterized by simple manufacture, effective enhancement of sealing strength, and improvement of sealing yield in no need of changing any manufacturing conditions.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A sealing method of a display panel, the display panel having a display area and a non-display area surrounding the display area, the sealing method comprising:
    providing a first substrate, the first substrate having a pixel array in the display area;
    forming an absorption material layer on the first substrate in the non-display area, wherein the absorption material layer is a single layer, and the absorption material layer comprises metal silicide;
    providing a second substrate, the second substrate having a sealing material layer in the non-display area;
    assembling the second substrate and the first substrate and forming a display medium between the first substrate and the second substrate, wherein the absorption material layer and the sealing material layer at least partially overlap; and
    performing a laser processing process on the sealing material layer of the second substrate, such that the first substrate and the second substrate are adhered by the sealing material layer, wherein the absorption material layer is adopted for absorbing a portion of a laser beam passing through the sealing material layer in the laser processing process.

2. The sealing method as recited in claim 1, wherein the step of providing the first substrate comprises forming a plurality of lead lines in the non-display area, and the step of forming an absorption material layer comprises at least forming the absorption material layer in a lead line region of the first substrate, the lead line region is where the leads lines are located in the non-display area, and the absorption material layer at least covers the lead lines.

3. The sealing method as recited in claim 2, wherein the step of assembling the second substrate and the first substrate comprises overlapping the absorption material layer and the sealing material layer partially in a vertical projection direction.

4. The sealing method as recited in claim 1, wherein the step of assembling the second substrate and the first substrate comprises overlapping the absorption material layer and the sealing material layer completely in a vertical projection direction.

5. The sealing method as recited in claim 1, wherein a wavelength of the laser beam in the laser processing process ranges from about 800 nm to about 1100 nm.

6. The sealing method as recited in claim 5, wherein the wavelength of the laser beam in the laser processing process is about 808 nm, an absorption coefficient of the absorption material layer ranges from about 1.84E+5 cm$^{-1}$ to about 1.03E+6 cm$^{-1}$, and a thickness of the absorption material layer ranges from about 0.02 μm to about 0.21 μm.

7. The sealing method as recited in claim 5, wherein the wavelength of the laser beam in the laser processing process is about 940 nm, an absorption coefficient of the absorption material layer ranges from about 1.38E+5 cm$^{-1}$ to about 6.09E+5 cm$^{-1}$, and a thickness of the absorption material layer ranges from about 0.04 μm to about 0.28 μm.

8. The sealing method as recited in claim 1, wherein the sealing material layer comprises glass frit.

9. A display panel having a display area and a non-display area surrounding the display area, the display panel comprising:
a first substrate comprising a pixel array and an absorption material layer, the pixel array being located in the display area, the absorption material layer being located in the non-display area, wherein the absorption material layer is a single layer and the absorption material layer comprises metal silicide;
a second substrate comprising a sealing material layer in the non-display area, wherein the absorption material layer and the sealing material layer at least partially overlap in a vertical projection direction; and
a display medium located between the first substrate and the second substrate.

10. The display panel as recited in claim 9, wherein the first substrate further comprises a plurality of lead lines in the non-display area, and the absorption material layer at least covers the lead lines.

11. The display panel as recited in claim 9, wherein the absorption material layer and the sealing material layer completely overlap in the vertical projection direction.

12. The display panel as recited in claim 9, wherein the absorption material layer is made of a material absorbing a laser beam, an absorption coefficient of the absorption material layer ranges from about 1.84E+5 cm$^{-1}$ to about 1.03E+6 cm$^{-1}$, and a thickness of the absorption material layer ranges from about 0.02 μm to about 0.21 μM.

13. The display panel as recited in claim 9, wherein the absorption material layer is made of a material absorbing a laser beam, an absorption coefficient of the absorption material layer ranges from about 1.38E+5 cm$^{-1}$ to about 6.09E+5 cm$^{-1}$, and a thickness of the absorption material layer ranges from about 0.04 μm to about 0.28 μm.

14. The display panel as recited in claim 9, wherein the sealing material layer comprises glass frit.

15. The display panel as recited in claim 9, wherein the absorption material layer is made of a material absorbing a laser beam, an absorption coefficient of the absorption material layer ranges from about 1.09E+4 cm$^{-1}$ to about 3.72E+4 cm$^{-1}$, and a thickness of the absorption material layer ranges from about 0.62 μm to about 3.59 μm.

16. A sealing method of a display panel, the display panel having a display area and a non-display area surrounding the display area, the sealing method comprising:
providing a first substrate, the first substrate having a pixel array in the display area;
forming an absorption material layer on the first substrate in the non-display area, wherein the absorption material layer is a single layer, and the absorption material layer comprises a group IIIA-VA compound;
providing a second substrate, the second substrate having a sealing material layer in the non-display area;
assembling the second substrate and the first substrate and forming a display medium between the first substrate and the second substrate, wherein the absorption material layer and the sealing material layer at least partially overlap; and
performing a laser processing process on the sealing material layer of the second substrate, such that the first substrate and the second substrate are adhered by the sealing material layer, wherein the absorption material layer is adopted for absorbing a portion of a laser beam passing through the sealing material layer in the laser processing process.

17. The sealing method as recited in claim 16, wherein the wavelength of the laser beam in the laser processing process is about 808 nm, an absorption coefficient of the absorption material layer ranges from about 1.34E+4 cm$^{-1}$ to about 1.06E+5 cm$^{-1}$, and a thickness of the absorption material layer ranges from about 0.22 μm to about 2.91 μm.

18. The sealing method as recited in claim 16, wherein the wavelength of the laser beam in the laser processing process is about 940 nm, an absorption coefficient of the absorption material layer ranges from about 1.09E+4 cm$^{-1}$ to about 3.72E+4 cm$^{-1}$, and a thickness of the absorption material layer ranges from about 0.62 μm to about 3.59 μm.

19. A display panel having a display area and a non-display area surrounding the display area, the display panel comprising:
a first substrate comprising a pixel array and an absorption material layer, the pixel array being located in the display area, the absorption material layer being located in the non-display area, wherein the absorption material layer is a single layer and the absorption material layer comprises a group IIIA-VA compound;
a second substrate comprising a sealing material layer in the non-display area, wherein the absorption material layer and the sealing material layer at least partially overlap in a vertical projection direction; and
a display medium located between the first substrate and the second substrate.

20. The display panel as recited in claim 19, wherein the first substrate further comprises a plurality of lead lines in the non-display area, and the absorption material layer at least covers the lead lines.

21. The display panel as recited in claim 19, wherein the absorption material layer and the sealing material layer completely overlap in the vertical projection direction.

22. The display panel as recited in claim 19, wherein the absorption material layer is made of a material absorbing a laser beam, an absorption coefficient of the absorption material layer ranges from about 1.34E+4 cm$^{-1}$ to about 1.06E+5 cm$^{-1}$, and a thickness of the absorption material layer ranges from about 0.22 μm to about 2.91 μm.

23. The display panel as recited in claim 19, wherein the sealing material layer comprises glass frit.

* * * * *